(12) United States Patent
Ryu et al.

(10) Patent No.: US 9,864,477 B2
(45) Date of Patent: Jan. 9, 2018

(54) TOUCH DEVICE

(71) Applicant: LG INNOTEK CO., LTD., Seoul (KR)

(72) Inventors: Ji Chang Ryu, Seoul (KR); Byung Youl Moon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 13 days.

(21) Appl. No.: 14/815,017

(22) Filed: Jul. 31, 2015

(65) Prior Publication Data

US 2016/0034078 A1 Feb. 4, 2016

(30) Foreign Application Priority Data

Jul. 31, 2014 (KR) .................. 10-2014-0098088

(51) Int. Cl.
*G06F 3/047* (2006.01)
*G02F 1/1333* (2006.01)
*G06F 3/041* (2006.01)
*G09G 5/00* (2006.01)
*H01L 27/32* (2006.01)
(Continued)

(52) U.S. Cl.
CPC .......... *G06F 3/047* (2013.01); *G02F 1/13338* (2013.01); *G02F 1/133308* (2013.01); *G06F 1/16* (2013.01); *G06F 1/1637* (2013.01); *G06F 3/044* (2013.01); *G06F 3/0416* (2013.01); *G09G 5/003* (2013.01); *H01L 27/323* (2013.01); *H01L 27/3244* (2013.01); *G02F 1/13452* (2013.01); *G02F 1/133305* (2013.01); *G02F 2202/28* (2013.01); *G06F 2203/04102* (2013.01);
(Continued)

(58) Field of Classification Search
CPC ...... G06F 3/044; G06F 3/0412; G06F 3/0416; G06F 2203/04102; G06F 2203/04103; G06F 1/16; G06F 1/1637; G06F 1/1641; G06F 1/1652; G02F 1/13338; G02F 1/133305; G02F 1/133308; G02F 1/13452; G02F 2202/28; G09G 5/003; H01L 27/3244; H01L 27/323; H01L 27/3276; H01L 51/0097
See application file for complete search history.

(56) References Cited

U.S. PATENT DOCUMENTS 8,736,162 B2* 5/2014 Jin ........................... G09F 9/33
313/483
9,335,871 B2* 5/2016 Kitano .................. G06F 1/1656
(Continued)

FOREIGN PATENT DOCUMENTS

EP          1 971 111 A2    9/2008
KR    10-2011-0085233 A    7/2011
(Continued)

OTHER PUBLICATIONS

European Search Report dated Dec. 23, 2015 issued in Application No. 15178482.4.
(Continued)

*Primary Examiner* — Dismery Mercedes
(74) *Attorney, Agent, or Firm* — KED & Associates, LLP (57) ABSTRACT

Disclosed is a touch device. The touch device includes a case; a cover substrate on the case; and an electrode member received in the case, wherein the electrode member has a cross-sectional area larger than that of the cover substrate.

18 Claims, 10 Drawing Sheets

(51) Int. Cl.
*G06F 1/16* (2006.01)
*G06F 3/044* (2006.01)
*G02F 1/1345* (2006.01)
*H01L 51/52* (2006.01)

(52) U.S. Cl.
CPC .. *G09G 2300/0426* (2013.01); *H01L 27/3276* (2013.01); *H01L 51/5246* (2013.01)

(56) References Cited

U.S. PATENT DOCUMENTS

| | | | |
|---|---|---|---|
| 9,571,095 B2* | 2/2017 | Ma | H03K 17/96 |
| 9,626,019 B2* | 4/2017 | Lee | G06F 3/044 |
| 9,627,463 B2* | 4/2017 | Kwon | H01L 27/3276 |
| 9,652,098 B2* | 5/2017 | Choi | G06F 3/044 |
| 2008/0223708 A1* | 9/2008 | Joo | H04M 1/0202 |
| | | | 200/600 |
| 2009/0236151 A1 | 9/2009 | Yeh et al. | |
| 2013/0002133 A1* | 1/2013 | Jin | H01L 51/524 |
| | | | 313/511 |
| 2013/0002572 A1 | 1/2013 | Jin et al. | |
| 2013/0032414 A1* | 2/2013 | Yilmaz | G06F 1/169 |
| | | | 178/18.06 |
| 2013/0076649 A1* | 3/2013 | Myers | H04M 1/0268 |
| | | | 345/173 |
| 2013/0306451 A1* | 11/2013 | Lee | H01H 9/02 |
| | | | 200/304 |
| 2014/0016048 A1* | 1/2014 | Omote | G06F 3/044 |
| | | | 349/12 |
| 2014/0063719 A1* | 3/2014 | Yamazaki | G06F 1/1601 |
| | | | 361/679.21 |
| 2014/0139758 A1* | 5/2014 | Jian | G06F 3/0416 |
| | | | 349/12 |
| 2014/0183473 A1* | 7/2014 | Lee | H01L 51/0097 |
| | | | 257/40 |
| 2015/0160760 A1* | 6/2015 | Sato | G06F 3/044 |
| | | | 345/174 |
| 2015/0261332 A1* | 9/2015 | Nakamura | G06F 3/0412 |
| | | | 345/173 |
| 2016/0364075 A1* | 12/2016 | Mizuno | G06F 1/1626 |

FOREIGN PATENT DOCUMENTS

| | | |
|---|---|---|
| KR | 10-2013-0061156 A | 6/2013 |
| WO | WO 2014/041967 A1 | 3/2014 |

OTHER PUBLICATIONS

European Office Action dated Oct. 11, 2016 issued in Application No. 15178482.4.

\* cited by examiner

TOUCH DEVICE

CROSS-REFERENCE TO RELATED APPLICATION

This application claims priority under 35 U.S.C. §119 to Korean Application No. 10-2014-0098088 filed on Jul. 31, 2014, whose entire disclosure is hereby incorporated by reference.

BACKGROUND

1. Field

The embodiment relates to a touch device.

2. Background

Recently, a touch panel, which performs an input function through the touch of an image displayed on a display device by an input device, such as a stylus pen or a finger, has been applied to various electronic appliances.

The touch panel may be typically classified into a resistive touch panel and a capacitive touch panel. In the resistive touch panel, the position of the touch point is detected by detecting the variation of resistance according to the connection between electrodes when pressure is applied to an input device. In the capacitive touch panel, the position of the touch point is detected by detecting the variation of capacitance between electrodes when a finger of the user is touched on the capacitive touch panel. When taking into consideration the convenience of a fabrication scheme and a sensing power, the capacitive touch panel has been spotlighted in a smaller model touch panel recently.

Meanwhile, in recent years, as the type of a touch panel is various, in case of a touch device to which a touch panel having a size less than a cover glass is applied, a bezel for shielding a wire of the touch screen panel is required. In addition, in case of a touch device in which a part of a cover glass is bendable, the accuracy of combining the touch panel with the cover glass may be deteriorated.

BRIEF DESCRIPTION OF THE DRAWINGS

The embodiments will be described in detail with reference to the following drawings in which like reference numerals refer to like elements wherein.

DETAILED DESCRIPTION

In the following description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer (film), region, pattern, or structure shown in the drawings may be exaggerated, omitted or schematically drawn for the purpose of convenience or clarity. In addition, the size of each layer (film), region, pattern, or structure does not utterly reflect an actual size.

Hereinafter, an embodiment will be described in detail with reference to accompanying drawings.

Figure 1:
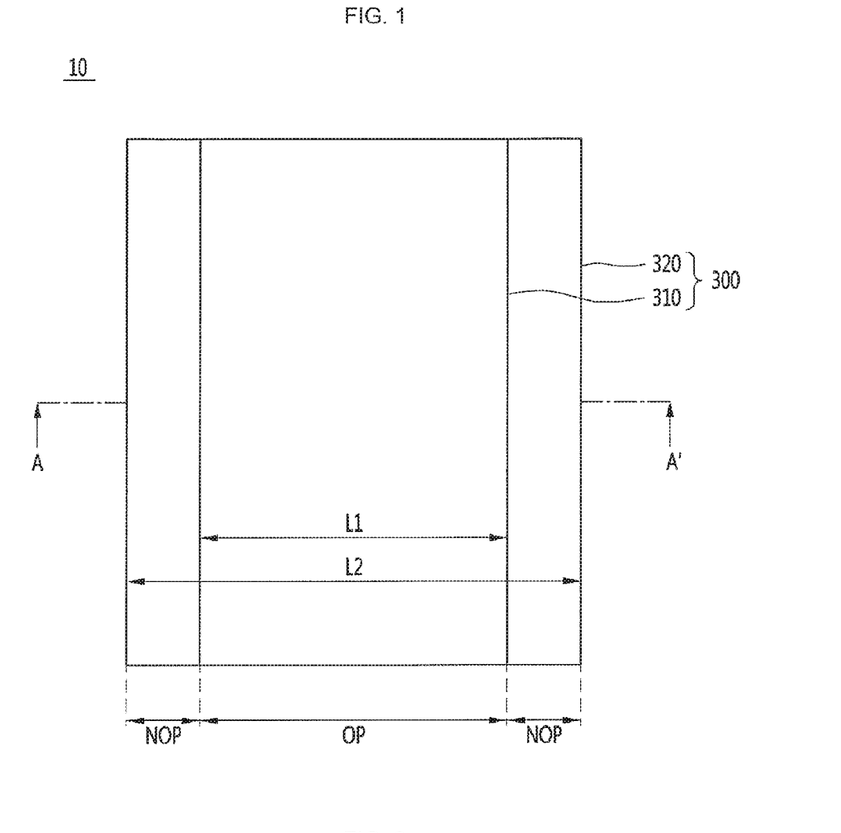
FIG. 1 is a schematic plan view showing a touch device to which the first to third embodiments are applied.
Figure 2:
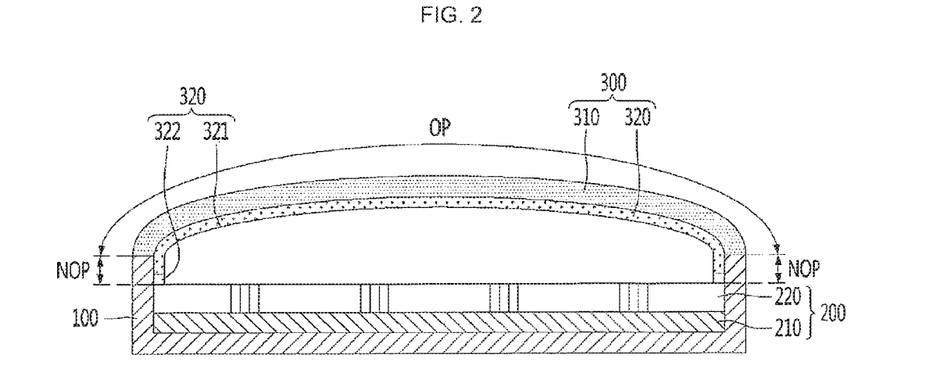
FIG. 2 is a sectional view taken along line A-A' of FIG. 1 according to the first embodiment.

First, a touch device according to the first embodiment will be described with reference to FIGS. 1 and 2. FIG. 1 is a schematic plan view showing a touch device according to the first embodiment. FIG. 2 is a sectional view taken along line A-A' of FIG. 1.

Referring to FIGS. 1 and 2, the touch device according to the first embodiment may include a case 100, a driving unit 200 and a touch panel 300.

The case 100 may receive the driving unit 200 and the touch panel 300.

The driving unit 200 may include a light module 210 and a display panel 220.

The display panel 220 may include a liquid crystal display (LCD), an electrophoretic display (EPD; Electric Paper Display), a plasma display (PDP), a field emission display (FED), an electro luminescence display device (ELD), an electro-wetting display (EWD), and an organic light emitting diode (OLED). Thus, the display panel 220 may be configured in various types. The light module 210 may include a light source for emitting light toward the display panel 220. For example, the light source may include a light emitting diode (LED) or an organic light emitting diode (OLED).

The display panel 220 may include a plurality of liquid crystal elements. The alignment of molecules in the liquid crystal elements may vary as an electrical signal is applied from the outside thereto, so that each of the liquid crystal elements may have directionality of a predetermined pattern.

The driving unit 200 may allow the lights emitted from the light module 210 to be refracted in mutually different patterns, respectively as the lights pass through the liquid crystal panel 220.

In addition, although not shown in the drawings, the driving unit 200 may have a polarizing filter and a color filter disposed on the display panel 220.

In addition, the driving unit 200 may include only the light module 210 without any display panels. For example, the driving unit 200 may include only a light module having light sources for each pixel which are individually driven.

In addition, the driving unit 200 may include only a display panel without any light modules. For example, the display panel, such as a field emission display, a plasma display, an organic light emitting diode (OLED) or an electrophoretic display (EPD), itself may include the light module.

The touch panel 300 may be disposed on the driving unit 200. In detail, the touch panel 300 may be disposed on the driving unit 200 received in the case 100. The touch panel 300 may adhere to the driving unit 200. In detail, the touch panel 300 may adhere to the driving unit 200 through optical clear adhesive (OCA). However, the embodiment is not limited to the above, and the touch panel 300 may be formed in an on-cell structure in which an electrode is directly formed on the driving unit 200 without using any adhesive or in an in-cell structure in which the touch panel 300 is disposed in the driving unit 200.

The touch panel 300 may have a cover substrate 310 and an electrode member 320.

The cover substrate 310 may be rigid or flexible. In addition, the cover substrate 310 may be a curved or bended substrate. Thus, the touch device having the cover substrate 310 may be also formed to have a flexible, curved or bended property. For this reason, the touch device according to the embodiment may be easily portable and may be variously modified in design.

The cover substrate 310 may include glass or plastic. In detail, the cover substrate 310 may include chemically tempered/semi-tempered glass, such as soda lime glass or aluminosilicate glass, plastic, such as polyethylene terephthalate (PET), polyimide (PI), propylene glycol (PPG) or polycarbonate (PC), or sapphire.

The sapphire has superior electric characteristics, such as permittivity, so that a touch response speed may be greatly increased and a space touch such as hovering may be easily implemented. In addition, since the sapphire has high surface hardness, the sapphire is applicable to a cover substrate. The hovering refers to a technique of recognizing coordinates even at a slight distance from a display.

Meanwhile, the electrode member 320 may include a sensing electrode 321 and a wire electrode 322. The sensing and wire electrodes 321 and 322 may include at least one of a nanowire, a photo sensitive nanowire film, a carbon nanotube (CNT), graphene and conductive polymer.

In addition, the sensing electrode 321 may include a first sensing electrode and a second sensing electrode spaced part from the first sensing electrode. At least one of the first and second sensing electrodes may include a transparent conductive material that allows electricity to flow therethrough without interrupting transmission of light. For example, the sensing electrode 321 may include metal oxide such as indium tin oxide (ITO), indium zinc oxide (IZO), copper oxide, tin oxide, zinc oxide, or titanium oxide.

In addition, at least one of the first and second sensing electrodes may include various metals. For example, the sensing electrode 321 may include at least one of Cr, Ni, Cu, Al, Ag, Mo, Au, Ti and the alloy thereof.

The wire electrode 322 may include first and second wire electrodes. The first and second wire electrodes may include a metal having excellent electrical conductivity. For example, the wire electrode may have a material equal or similar to the sensing electrode 321 described above.

The electrode member 320 may be formed to have an area larger than that of the cover substrate 310. In detail, the electrode member 320 may be larger than the cover substrate 310 in at least one direction. That is, the electrode member 320 may have an excessive portion in comparison with the area of the cover substrate 310 and the excessive portion may be received in the case 100.

In detail, at least one surface of the electrode member 320 may be larger than the cover substrate 310. That is, one surface of the electrode member 320 may be received in the case 100. Thus, the sensing or wire electrode 321 or 322 constituting the electrode member 320 may be received in the case 100.

The sensing or wire electrode 321 or 322 received in the case 100 may adhere to one side surface of the case 100. In detail, a region of the sensing or wire electrode 321 or 322 received in the case 100 may adhere to the corresponding side surface of the case 100.

That is, in the embodiment, since the electrode member 320 is formed to have a size greater than the cover substrate 310, the electrode member 320 may have an advantage of easily adhering to the cover substrate 310 having a curved or irregular shape.

Therefore, by applying the touch panel having a curved surface and/or the display panel having a curved surface to the touch device including the touch panel 300, the bezel having an entirely curved outer surface may be minimized.

Figure 3:
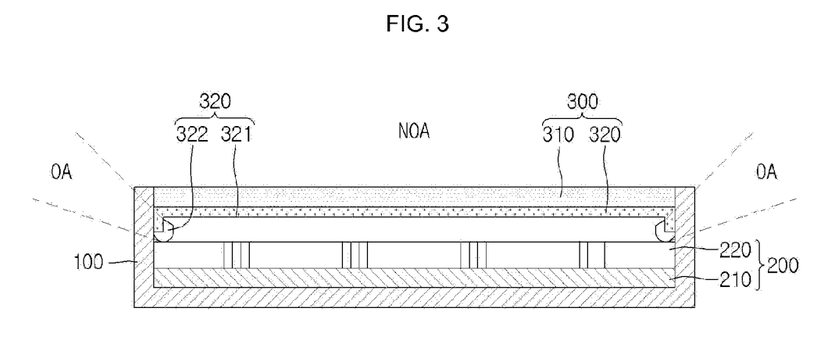
FIG. 3 is a sectional view taken along line A-A' of FIG. 1 according to the second embodiment.

According to the second embodiment, the wire electrode 322 of the sensing electrode 321 and the wire electrode 322 received in the case 100 may overlap the sensing electrode 321.

In detail, a touch device according to the second embodiment will be described with reference to FIG. 3. In the following description about the touch device according to the second embodiment, the parts similar or identical to those of the touch device of the first embodiment previously described will be omitted. In addition, the same reference numerals will be assigned to the elements the same as those of the first and second embodiments. FIG. 3 is a sectional view taken along line A-A' of FIG. 1 according to the second embodiment.

The touch device according to the second embodiment may include a case 100, a driving unit 200 and a touch panel 300.

The driving unit 200 may be received in the case 100.

In addition, the touch panel 300 may be disposed on the driving unit 200.

The touch panel 300 may include a cover substrate 310 and an electrode member 320.

The electrode member 320 may include a substrate, a sensing electrode 321 formed on the substrate and a wire electrode 322.

The electrode member 320 may be formed to have an area larger than the cover substrate 310.

In detail, the electrode member 320 may be larger than the cover substrate 310 in at least one direction. That is, the electrode member 320 may have an excessive portion in comparison with the area of the cover substrate 310 and the excessive portion may be received in the case 100.

In particular, the electrode member 320 received in the case 100 may be a part of the sensing electrode 321 or the wire electrode 322. In addition, according to the second embodiment, the wire electrode 322 may overlap a part of the sensing electrode 321. In detail, according to the second embodiment, the electrode member 320 may include a first area NOA in which the sensing and wire electrodes 321 and 322 do not overlap each other, and at least one second area OA which is adjacent to the first area NOA. In detail, the first area NOA is formed to allow the cover substrate 310 to correspond to a part of the sensing electrode 321 of the electrode member 320. In addition, the first area NOA may be an area in which the sensing electrode 321 does not overlap the wire electrode 322. In addition, the second area OA may be an area in which the sensing electrode 321 overlaps the wire electrode 322. In detail, a part of the sensing electrode 321 may overlap the wire electrode 322 in the second area, so that the bezel for the wire electrode 322 of the corresponding area may be minimized.

That is, since the wire electrode 322 is disposed to overlap the sensing electrode 321 and received in the case 100, there is no need to form an additional bezel for the wire electrode 322, so that the bezel may be minimized.

Figure 4:
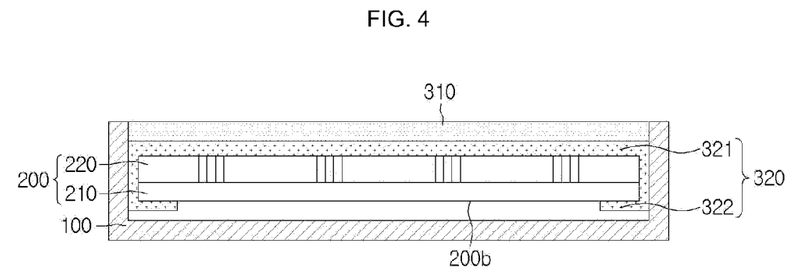
FIG. 4 is a sectional view taken along line A-A' of FIG. 1 according to the third embodiment.

According to the third embodiment, the sensing electrode 321 and the wire electrode 322 may be configured to surround a part of the driving unit 200.

In detail, a touch device according to the third embodiment will be described with reference to FIG. 4. In the following description about the touch device according to the third embodiment, the parts similar or identical to those of the touch device of the embodiments previously described will be omitted or described in brief. FIG. 4 is a sectional view taken along line A-A' of FIG. 1 according to the third embodiment.

The touch device according to the third embodiment may include a case 100, a driving unit 200 and a touch panel 300.

The touch panel 300 may include a cover substrate 310 and an electrode member 320.

The electrode member 320 may include a substrate, a sensing electrode 321 formed on the substrate and a wire electrode 322.

The electrode member 320 may be formed to have an area larger than the cover substrate 310.

In detail, the electrode member 320 may be larger than the cover substrate 310 in at least one direction. That is, the electrode member 320 may have an excessive portion in comparison with the area of the cover substrate 310 and the excessive portion may be received in the case 100.

In particular, the electrode member 320 received in the case 100 may be a part of the sensing electrode 321 or a part of the wire electrode 322. In addition, the wire electrode 322 according to the third embodiment may surround one side of the sensing electrode 321 and the driving unit 200 and may extend to a rear surface 200b of the driving unit 200. Thus, a part of the wire electrode 322 may overlap the rear surface 200b of the driving unit 200. Therefore, there is no need to form an additional bezel for the wire electrode 322, so that the bezel may be minimized.

According to the fourth to eighth embodiments, the electrode member constituting the touch panel may be formed to protrude in one direction of the cover substrate.

In detail, the fourth to eighth embodiments will be described with reference to FIGS. 4 to 10. In the following descriptions about the touch devices according to the second embodiment, the parts similar or identical to those of the touch device of the first and third embodiments previously described will be omitted. In addition, the same reference numerals will be assigned to the elements the same as those of the first and third embodiments.

Figure 5:
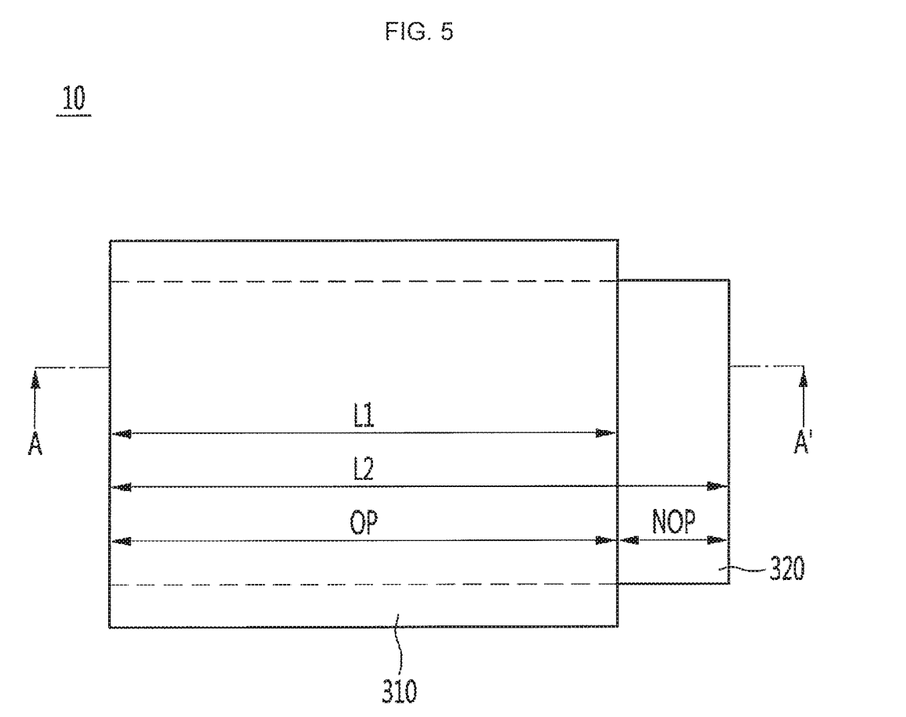
FIG. 5 is a schematic plan view showing a touch device to which the fourth to eighth embodiments are applied.
Figure 6:
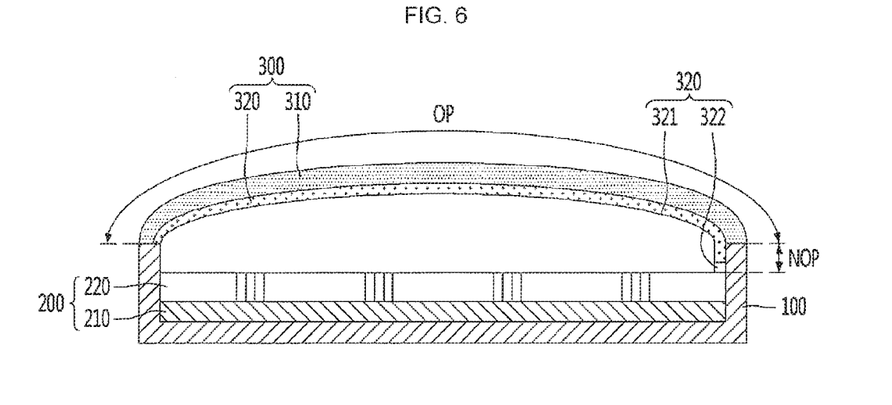
FIG. 6 is a sectional view taken along line A-A' of FIG. 5 according to the fourth embodiment.

FIG. 5 is a view illustrating examples of touch devices according to fourth to eighth embodiments. FIG. 6 is a sectional view taken along line A-A' of FIG. 5 according to the fourth embodiment.

Referring to FIGS. 5 and 6, the touch device according to the fourth embodiment may be formed to allow the electrode member 320 constituting the touch panel 300 to protrude in one direction of the cover substrate 310. In detail, the touch device according to the fourth embodiment may receive the display panel 200 and the touch panel 300 on the case 100.

The touch panel 300 may include a cover substrate 310 and an electrode member 320. The electrode member 320 according to the fourth embodiment may include a protrusion part 400 protruding in one direction of the cover substrate 310. That is, one side of the electrode member 320 may be formed to correspond to the cover substrate 310. In addition, the opposite side of the electrode member 320 may partially correspond to the cover substrate 310 such that the opposite side of the electrode member 320 can protrude out of the cover substrate 310.

The protrusion part 400 of the electrode member 320 may allow the electrode member 320 to be stably disposed on the cover substrate 310 and the case 100, so that the reliability may be improved. Thus, the touch input may be recognized through the entire surface of the cover substrate 310, and the bezel may be minimized.

Although the protrusion part 400 protruding in a specific direction has been described with reference to FIGS. 4 to 6, the embodiment is not limited thereto.

According to the fourth embodiment, the electrode member 320 constituting the touch panel 300 may includes the protrusion part 400 which is received in the case 100. In detail, the protrusion part 400 received in the case 100 may include a part of the sensing electrode 321 or at least one of the wire electrodes 322. As shown in FIG. 6, a part of the sensing electrode 321 and the wire electrode 322 extending from the sensing electrode 321 may be disposed on the protrusion part 400.

The protrusion part 400 of the electrode member 320 may allow the electrode member 320 to be stably disposed on the cover substrate 310 and the case 100, so that the reliability may be improved, the touch input may be recognized through the entire surface of the bended cover substrate 310, and the bezel may be minimized.

Figure 7:
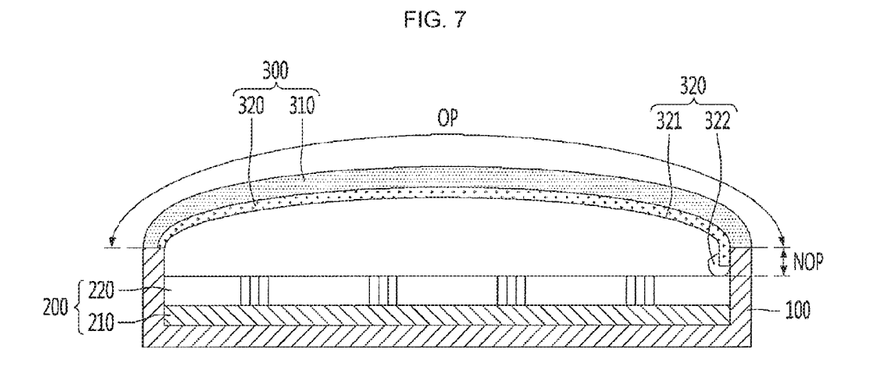
FIG. 7 is a sectional view taken along line A-A' of FIG. 5 according to the fifth embodiment.

In addition, the touch panel 300 of a touch device according to the fifth embodiment may be disposed to allow the sensing electrode 321 constituting the electrode member 320 to overlap the wire electrode 322 on the protrusion part 400.

FIG. 7 is a sectional view taken along line A-A' of FIG. 5 according to the fifth embodiment. Referring to FIG. 7, the electrode member 320 may form the protrusion part 400 and the protrusion part 400 may be received in the case 100. In detail, the protrusion part 400 received in the case 100 may be disposed to allow a part of the sensing electrode 321 to correspond to the wire electrode 322 overlapping the sensing electrode 321. The protrusion part 400 may include a curved surface. Thus, an area of the wire electrode 322 according to the electrode member 320 constituting the touch panel 300 may be minimized. In addition, the cover substrate 310 according to the fifth embodiment of FIG. 7 may include a curved surface. The touch panel 300 of the touch device according to the embodiment may have a curved surface which is concave or convex with respect to the display panel. In addition, the electrode member 320 may be formed to have at least one of concave and convex surfaces. Thus, since there is no need to form an additional bezel for the wire electrode 322, so that the bezel may be minimized.

Figure 8:
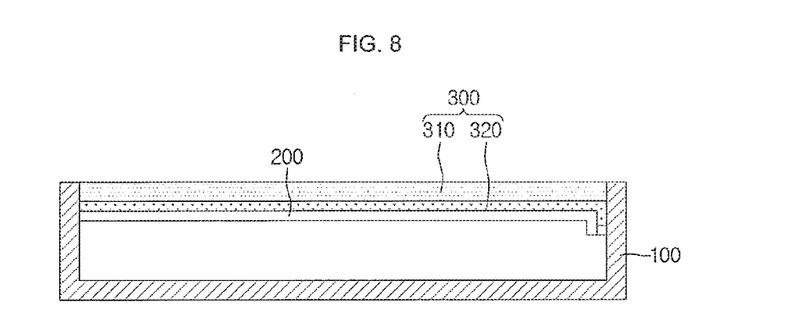
FIG. 8 is a sectional view taken along line A-A' of FIG. 5 according to the sixth embodiment.

According to the sixth embodiment, the display panel 220 of the driving unit provided in the touch device may be prepared as an organic electroluminescent display panel including the light module.

FIG. 8 is a sectional view taken along line A-A' of FIG. 5 according to the sixth embodiment. Referring to FIG. 8, the organic electroluminescent display panel included in the driving part 200 applied to the touch device according to the sixth embodiment includes a self-emissive device that does not require an additional light source. The organic electroluminescent display panel includes a thin film transistor (TFT) formed on a first substrate (not shown) and an organic light emitting device connected to the TFT. The organic light emitting device may include an anode, a cathode, and an organic light emitting layer interposed between the anode and the cathode. In addition, the organic electroluminescent display panel may further include a second substrate (not shown) formed on the organic light emitting device and serving as an encapsulation substrate for encapsulation.

Therefore, the driving unit 200 according to the sixth embodiment may adhere to a lower portion of the touch panel 300, so that a thickness of the touch device may be thinned.

Figure 9:
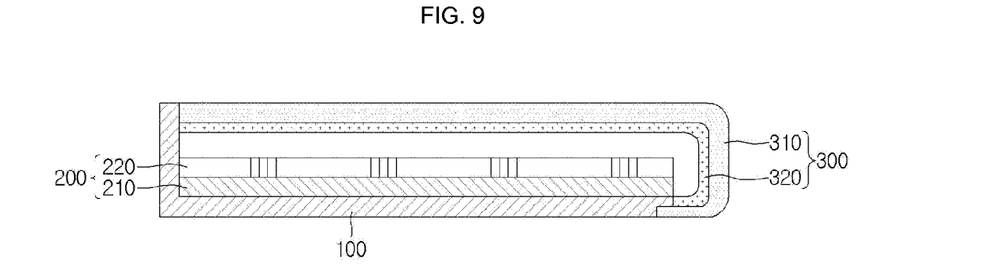
FIG. 9 is a sectional view taken along line A-A' of FIG. 5 according to the seventh embodiment.

FIG. 9 is a sectional view taken along line A-A' of FIG. 5 according to the seventh embodiment. Referring to FIG. 9, the touch device according to the seventh embodiment may include a touch panel 300 curved along one side of the touch device. In addition, a part of the touch panel having a curved surface may make contact with a part of a bottom surface of the case 100. In detail, according to the touch device of the seventh embodiment depicted in FIG. 9, at least one part of the touch panel 300 may have a curved surface and extend to a bottom surface of the touch device, that is, the bottom surface of the case, so that the area for a touch input may be enlarged.

Figure 10:
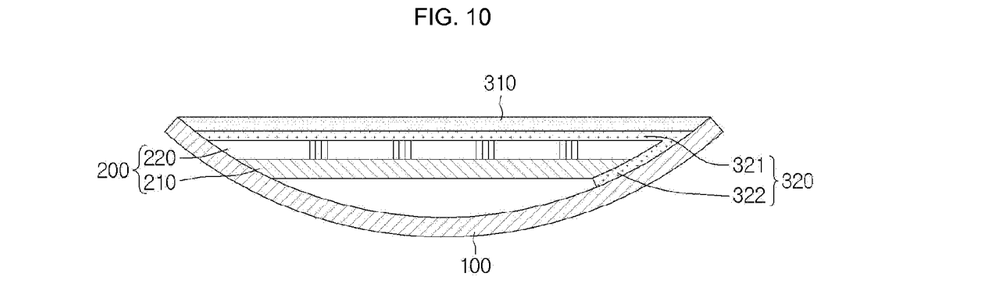
FIG. 10 is a sectional view taken along line A-A' of FIG. 5 according to the eighth embodiment.

FIG. 10 is a sectional view taken along line A-A' of FIG. 5 according to the eighth embodiment. Referring to FIG. 10, the touch device according to the eighth embodiment may be formed to allow a case 100 to have a curved surface. In detail, the case 100 of the touch device according to the eighth embodiment may include a driving unit 200 and a touch panel 300.

The touch panel 300 may include a cover substrate 310 and an electrode member 320.

The electrode member 320 may include a substrate, a sensing electrode 321 formed on the substrate and a wire electrode 322.

The electrode member 320 may be disposed on a bottom surface of the cover substrate 310 and extend to a bottom surface of the driving unit 200 in one direction of the cover substrate 310. The extending electrode member 320 may include at least one of a part of the sensing electrode 321 and the wire electrode 322. The extending electrode member 320 may extend along one side of the curved case 100.

When the driving unit 200 is an organic electroluminescent display panel, the organic electroluminescent display panel includes a self-emissive device that does not require an additional light source. The organic electroluminescent display panel includes a TFT formed on a first substrate (not shown) and an organic light emitting device connected to the TFT. The organic light emitting device may include an anode, a cathode, and an organic light emitting layer interposed between the anode and the cathode. In addition, the organic electroluminescent display panel may further include a second substrate (not shown) formed on the organic light emitting device and serving as an encapsulation substrate for encapsulation.

Thus, the size of a bezel may be minimized, the area for a touch input may be enlarged, and a thickness of the touch device may be thinned.

Figure 11:
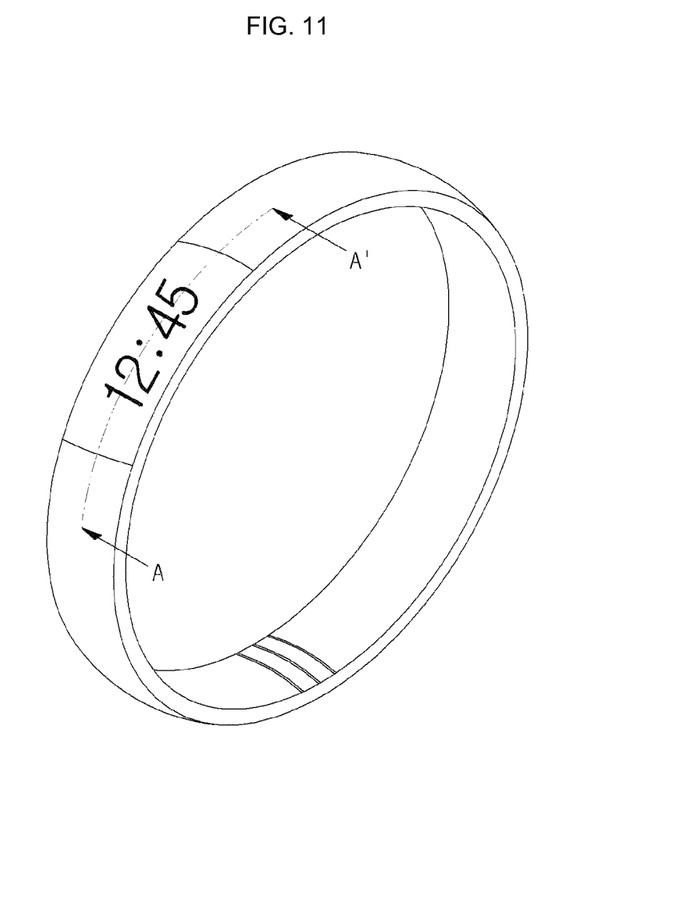
FIG. 11 is a view showing one example of a touch device according to an embodiment.
Figure 12:
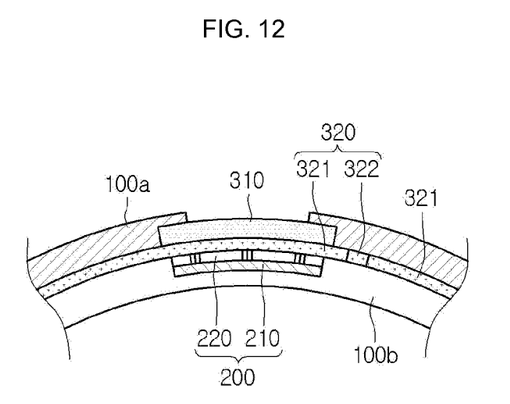
FIG. 12 is a sectional view taken along line A-A' of FIG. 11.

FIG. 11 is a view illustrating one example of a touch device to which an embodiment is applied. FIG. 12 is a sectional view taken along line A-A' of FIG. 11. Referring to FIGS. 11 and 12, a touch device to which an embodiment depicted in FIG. 7 is applied may be a watch-type terminal having a touch structure by which an input of a user may be performed in various areas.

As shown in FIG. 12, the watch-type terminal of FIG. 11 may include a case 100, a driving unit 200 and a touch panel 300.

The case 100 may be flat or have a curved surface to receive the driving unit 200 and the touch panel 300. The case 100 may include an upper case and a lower case which adhere to each other. In detail, the case 100 may include the upper case which is formed in a user visible area to protect or cover parts of the driving unit 200 and the touch panel 300, and the lower case which adheres to the upper case to be formed below the upper case. However, the shape of the case is not limited to the above and may be variously formed according to a device to which the case is applied.

The touch panel 300 may include a cover substrate 310 and an electrode member 320.

The cover substrate 310 may be rigid or flexible. In detail, the cover substrate 310 may include chemically tempered glass such as soda lime glass or aluminosilicate glass, plastic such as polyethylene terephthalate (PET) or polyimide (PI), or sapphire.

The sapphire has superior electric characteristics, such as permittivity, so that a touch response speed may be greatly increased and a space touch such as hovering may be easily implemented. In addition, since the sapphire has a high surface hardness, the sapphire is applicable to a cover substrate. The hovering refers to a technique of recognizing coordinates even at a slight distance from a display.

The electrode member 320 may include a sensing electrode 321 and a wire electrode 322.

In particular, as shown in FIG. 11, the sensing electrode 321 and the wire electrode 322 of the electrode member 320 may be formed to allow a user to perform a touch input in a partial area or an entire area of the watch-type terminal. In detail, a user touch input may be sensed in an area of the cover substrate 310 and an area in which the sensing electrode 321 of the case is disposed. Thus, the electrode member 320 including the sensing electrode 321 and the wire electrode 322 may be formed to have an area larger than the cover substrate 310 in at least one direction.

The sensing electrode 321 may include a first sensing electrode and a second sensing electrode. At least one of the first and second sensing electrodes may include a transparent conductive material that allows electricity to flow therethrough without interrupting transmission of light. For example, the sensing electrode 321 may include metal oxide such as indium tin oxide (ITO), indium zinc oxide (IZO), copper oxide, tin oxide, zinc oxide, or titanium oxide.

In addition, at least one of the first and second sensing electrodes may include various metals. For example, the sensing electrode 321 may include at least one of Cr, Ni, Cu, Al, Ag, Mo, Au, Ti and the alloy thereof.

The second sensing electrode may be formed on a lower portion of the cover substrate 310 to sense a touch even on an unactive area.

The wire electrode 322 may include first and second wire electrodes. The first and second wire electrodes may include a metal having excellent electrical conductivity. For example, the wire electrode may have a material equal or similar to the sensing electrode 321 described above.

The driving unit 200 may include a light module 210 and a display panel 220.

The display panel 220 may include a liquid crystal display (LCD), a field emission display (FED), a plasma display (PDP), an organic light emitting diode (OLED) and an electrophoretic display (EPD; Electric Paper Display). Thus, the display panel 220 may be configured in various types.

The light module 210 may include a light source for emitting light toward the display panel 220. For example, the light source may include a light emitting diode (LED) or an organic light emitting diode (OLED).

The display panel 220 may include a plurality of liquid crystal elements. The alignment of molecules in the liquid crystal elements may vary as an electrical signal is applied from the outside thereto, so that each of the liquid crystal elements may have directionality of a predetermined pattern.

The driving unit 200 may allow the lights emitted from the light module 210 to be refracted in mutually different patterns, respectively as the lights pass through the liquid crystal panel 220.

In addition, although not shown in the drawings, the driving unit 200 may have a polarizing filter and a color filter disposed on the display panel 220.

In addition, the driving unit 200 may include only the light module 210 without any display panels. For example, the driving unit 200 may include only a light module having light sources for each pixel which are individually driven.

In addition, the driving unit 200 may include only a display panel without any light modules. For example, the display panel, such as a field emission display, a plasma display, an organic light emitting diode (OLED) or an electrophoretic display (EPD), itself may include the light module.

The touch panel 300 may be disposed on the driving unit 200. In detail, the touch panel 300 may be disposed on the driving unit 200 received in the case 100. The touch panel 300 may adhere to the driving unit 200. In detail, the touch panel 300 may adhere to the driving unit 200 through optical clear adhesive (OCA). However, the embodiment is not limited to the above, and the touch panel 300 may be formed in an on-cell structure in which an electrode is directly formed on the driving unit 200 without using any adhesive or in an in-cell structure in which the touch panel 300 is disposed in the driving unit 200.

In addition, the display panel 220 of the driving unit 200 may be prepared as an organic electroluminescent display panel including a light module. The organic electroluminescent display panel includes a self-emissive device that does not require an additional light source. The organic electroluminescent display panel includes a TFT formed on a first substrate (not shown) and an organic light emitting device connected to the TFT. The organic light emitting device may include an anode, a cathode, and an organic light emitting layer interposed between the anode and the cathode. In addition, the organic electroluminescent display panel may further include a second substrate (not shown) formed on the organic light emitting device and serving as an encapsulation substrate for encapsulation Therefore, the driving unit 200 according to the sixth embodiment may adhere to a lower portion of the touch panel 300, so that a thickness of the touch device may be thinned.

Figure 13:
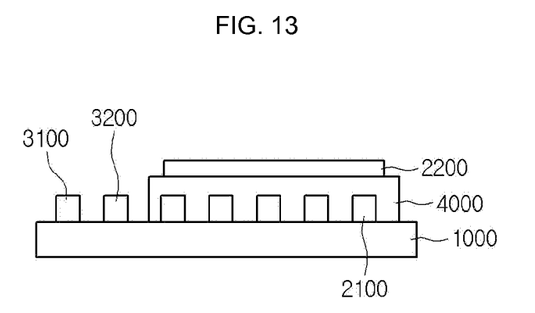
FIGS. 13 to 15 are views illustrating various types of a touch window according to embodiments.
Figure 14:
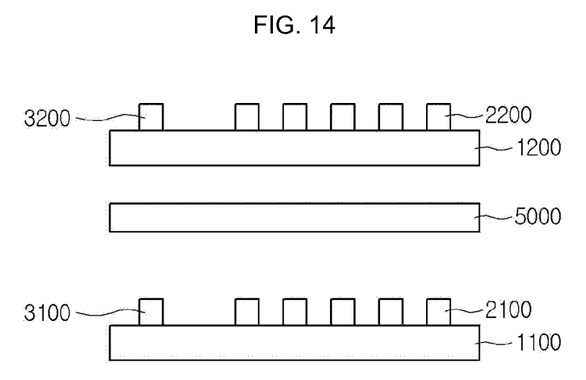
Figure 15:
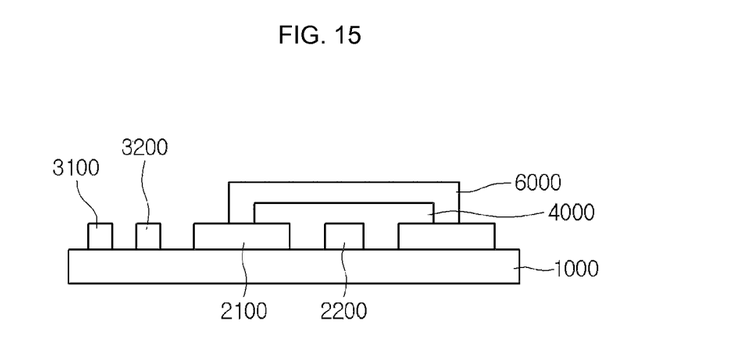

FIGS. 13 to 15 are views illustrating various types of touch windows according to embodiments.

Referring to FIG. 13, the touch panel 300 applied to a touch device according to an embodiment may include first and second sensing electrodes 2100 and 2200 on a substrate 1000, and first and second wire electrodes 3100 and 3200 for connecting the first and second sensing electrodes 2100 and 2200. In detail, the first and second sensing electrodes 2100 and 2200 may be disposed while interposing an insulating layer 4000 therebetween, so that the first and second sensing electrodes 2100 and 2200 may be insulated from each other.

Referring to FIG. 14, the touch panel 300 applied to a touch device according to an embodiment includes first and second substrates 1100 and 1200.

A first sensing electrode 2100 and a first wire electrode 3100 may be disposed on the first substrate 1100. The first sensing electrode 2100 may first and second sub-patterns and an electrode layer.

A second sensing electrode 2200 is disposed on the second substrate 1200. The second sensing electrode 2200 and a second wire electrode 3200 may be disposed. Similarly to the first sensing electrode 2100, the second sensing electrode 2200 may include first and second sub-patterns and an electrode layer.

An adhesive layer 5000 may be further interposed between the first and second substrates 1100 and 1200. The adhesive layer 5000 may be optical clear adhesive (OCA).

Referring to FIG. 15, the touch panel 300 applied to a touch device according to an embodiment may include a substrate 1000, and first and second electrodes 2100 and 2200 on the substrate 1000.

In detail, the first and second sensing electrodes 2100 and 2200 connected in mutually different directions, and the first and second wire electrodes 3100 and 3200 connected to the first and second sensing electrodes 2100 and 2200, respectively may be disposed on one surface of the substrate 1000, and the first and second sensing electrodes 2100 and 2200 may be insulated from each other on the same one surface of the substrate.

The first and second sensing electrodes 2100 and 2200 may be disposed on a cover substrate.

The touch panel of a touch device applied to an embodiment is not limited to the above type, and various types of touch panels may be applied to an embodiment.

For example, a touch panel may include the first and second sensing electrodes which are disposed on mutually different surfaces of the substrate.

In detail, the first sensing electrode may be disposed on a first surface of the substrate. The first sensing electrode may include first and second sub-patterns.

The first sensing electrode may be disposed on a second surface of the substrate. Similarly to the first sensing electrode, the second sensing electrode may include first and second sub-patterns, and an electrode layer.

As another example, the first sensing electrode may be directly disposed on the cover substrate. That is, the first sensing electrode may be directly formed on a bottom surface of the cover substrate. Thus, a thickness of the touch panel may be reduced. In this case, the first sensing electrode may include a conductive pattern which does not include any sub-patterns. Thus, the first sensing electrode may be formed through a process except for an imprinting process. For example, the first sensing electrode may be formed through depositing and etching processes.

Figure 16:
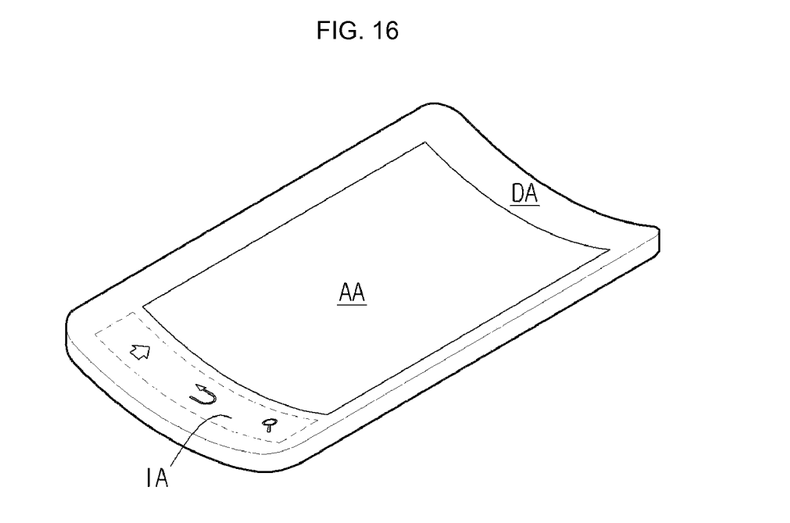
FIGS. 16 to 19 are views showing one example of a touch device according to an embodiment.

The substrate may be disposed on a lower part of the cover substrate and the second sensing electrode may be disposed on a top surface of the substrate. FIGS. 16 to 19 are views showing examples of a touch device according to embodiments. Referring to FIG. 16, there is shown a mobile terminal as one example of the touch device. The mobile terminal 1000 may include an active area AA and an unactive area UA. The active area may sense a touch signal when a finger touches the active area AA, and an instruction icon pattern part and a logo may be formed in the unactive area UA.

Figure 17:
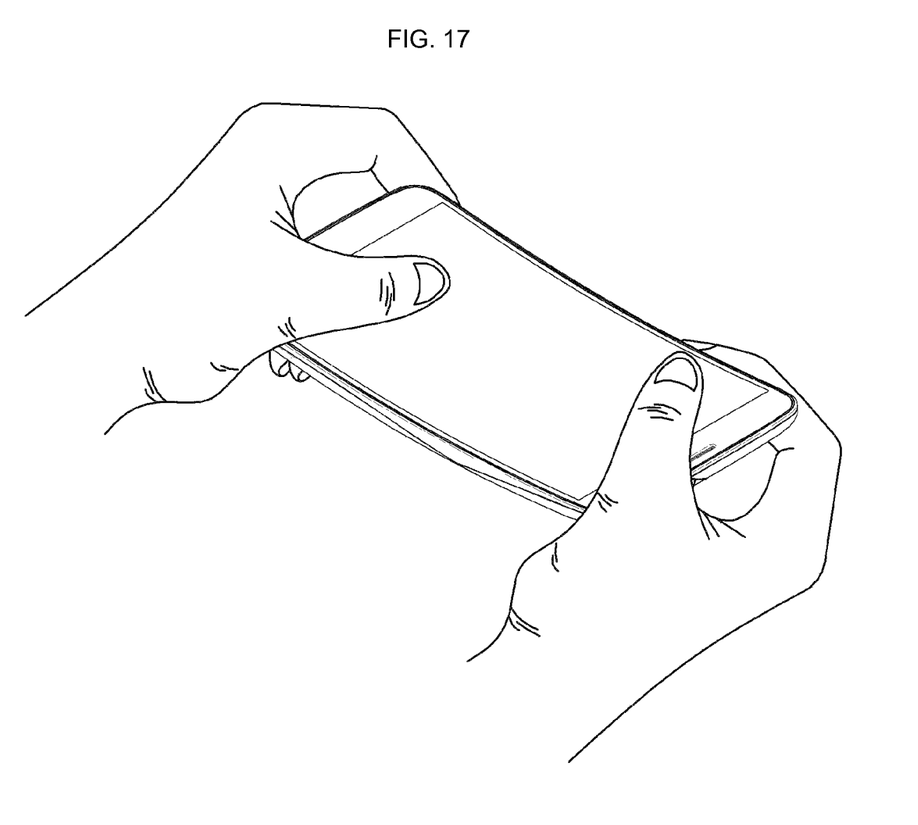

Referring to FIG. 17, the touch device may include a flexible touch window. Thus, the touch device including it may be a flexible touch device. Therefore, a user may flex or bend the display device with his hand.

Figure 18:
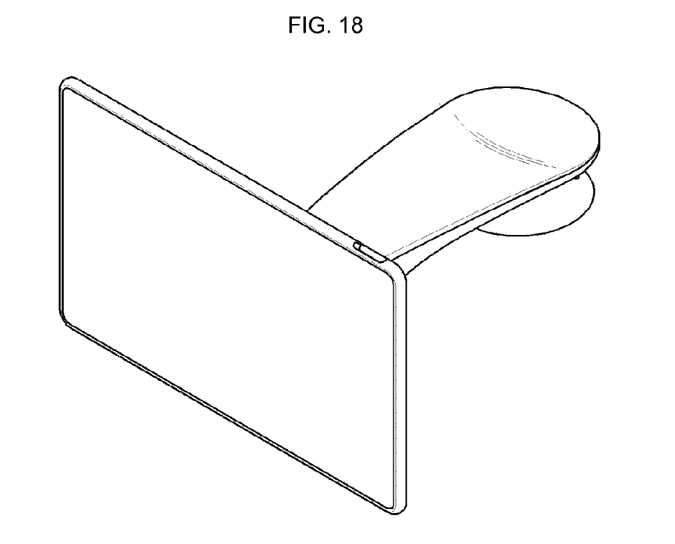
Figure 19:
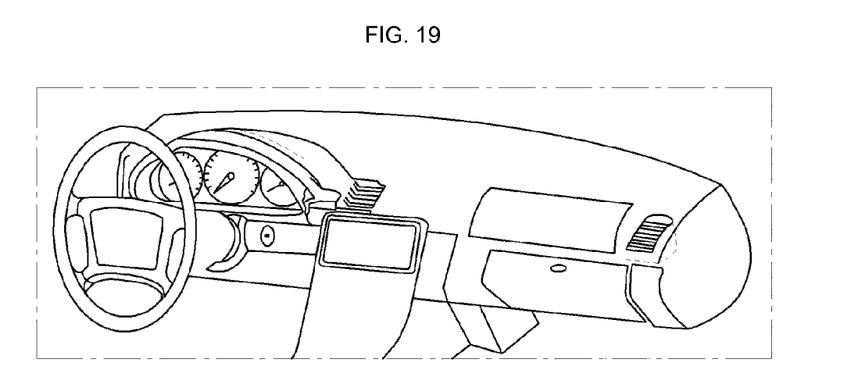

Referring to FIG. 18, the touch window may be applied into a vehicle navigation system as well as the touch device of a mobile terminal. In addition, referring to FIG. 19, the touch window may be applied to an inner part of a vehicle. In other words, the touch window may be applied to various parts in the vehicle. Accordingly, the touch window may be applied to a dashboard 100 as well as a PND (Personal Navigation Display), so that a CID (Center Information Display) may be realized. However, the embodiment is not limited to the above, and such a touch device may be used for various electronic appliances.

The embodiment is to provide a touch device which can improve the degree of freedom in design and visibility According to an embodiment, there is provided a touch device which includes: a case; a cover substrate on the case;

and an electrode member received in the case, wherein the electrode member has a cross-sectional area larger than a cross-sectional area of the cover substrate.

In addition, according to another embodiment, there is provided a touch device which includes: a case; a cover substrate on the case; and an electrode member received in the case, wherein the electrode member includes a protrusion part protruding out of the cover substrate.

In addition, according to still another embodiment, there is provided a touch device which includes: a case; a cover substrate on the case; and an electrode member received in the case, wherein the electrode member has a cross-sectional area larger than a cross-sectional area of the cover substrate and is formed on a partial area or an entire area of the case.

According to the touch device of the embodiment, by applying a touch panel having a curved surface and/or a display panel having a curved surface thereto, the touch device may have an entirely curved outer surface and the size of a bezel thereof may be minimized.

Therefore, according to the touch device of the embodiment, there may be an advantage in applying a curved surface thereto or implementing a large size of a touch device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch device comprising:
   a case;
   a driving unit including a display panel; and
   a touch panel that receives a touch input, the touch panel including:
      a cover substrate having an end in contact with the case;
      an electrode member adhered to a lower portion of the cover substrate via an adhesive and including:
         a substrate;
         a sensing electrode having a first sensing electrode and a second sensing electrode, which are provided on one surface of the substrate; and
         a wire electrode,
      wherein a length from one end to another end of the cover substrate in one direction is shorter than a length from one end to another end of the electrode member,
      wherein, the electrode member includes an overlapped portion corresponding to the cover substrate and having a shape corresponding to the cover substrate and a non-overlapped portion other than the overlapped portion,
      wherein at least a part of the non-overlapped portion is received in the case,
      wherein a top surface of the sensing electrode is adhered to the lower portion of the cover substrate via the adhesive, a bottom surface of the substrate on which the sensing electrode is provided is in direct contact with the driving unit, and a top surface of the wire electrode is in direct contact with the case,
      wherein the touch input is recognized throughout an entire area of the cover substrate,
      wherein the overlapped portion of the electrode member, the cover substrate, and the driving unit each have a curved surface,
      wherein the wire electrode includes a first wire electrode to connect the first sensing electrode and a second wire electrode to connect the second sensing electrode,
      wherein the first sensing electrode, the second sensing electrode, the first wire electrode, and the second wire electrode are provided on one surface of the substrate, and
      wherein an insulating layer to insulate the first sensing electrode and the second sensing electrode is partially provided on the sensing electrode.

2. The touch device of claim 1, wherein the wire electrode is received in the case.

3. The touch device of claim 1, wherein the wire electrode overlaps the sensing electrode.

4. The touch device of claim 1, wherein the sensing electrode includes:
   a first area overlapping the wire electrode; and
   a second area adjacent to the first area, and
   wherein the first area includes a curved surface.

5. The touch device of claim 1, wherein the electrode member surrounds the driving unit and extends toward a lower surface of the driving unit.

6. The touch device of claim 1, wherein the display panel includes a light module.

7. The touch device of claim 1, wherein the case has a curved surface.

8. The touch device of claim 1, wherein at least one of the sensing electrode and the wire electrode includes at least one of Cr, Ni, Cu, Al, Ag, Mo, Au, Ti, and an alloy thereof, or at least one of a nanowire, a photo sensitive nanowire film, a carbon nanotube (CNT), graphene and conductive polymer.

9. The touch device of claim 1, wherein the driving unit includes an organic electroluminescent display panel.

10. The touch device of claim 1, wherein the substrate of the electrode member is an encapsulation substrate.

11. A touch device comprising:
    a case; and
    a touch panel that receives a touch input, the touch panel including:
       a cover substrate provided on the case such that a curved end of the covet substrate and a curved end of the case contact each other; and
       an electrode member provided under the cover substrate and including:
          a substrate;
          a sensing electrode having a first sensing electrode and a second sensing electrode, which are provided on one surface of the substrate; and
          a wire electrode, wherein a length from one end to another end of the cover substrate in one direction is shorter than a length from one end to another end of the electrode member, wherein the electrode member includes an overlapped portion corresponding to the cover substrate and a non-overlapped portion other than the overlapped portion, wherein the case includes a driving unit, the driving unit including:
- a light module; and
- a flexible display panel on the light module, wherein a top surface of the sensing electrode is in direct contact with the cover substrate, a bottom surface of the substrate on which the sensing electrode is provided is in direct contact with the driving unit, and a top surface of the wire electrode is in direct contact with the case, wherein the touch input is recognized throughout an entire area of the cover substrate, and wherein the overlapped portion of the electrode member, the cover substrate, and the driving unit each has a curved surface.

12. The touch device of claim 11, wherein the non-overlapped portion corresponds to at least one of the sensing electrode and the wire electrode.

13. The touch device of claim 12, wherein the non-overlapped portion is a wire electrode and is received in the case.

14. The touch device of claim 12, wherein the non-overlapped portion is a wire electrode and overlaps the sensing electrode.

15. The touch device of claim 11, wherein the non-overlapped portion has a curved surface.

16. The touch device of claim 11, wherein at least one of the sensing electrode and the wire electrode includes at least one of Cr, Ni, Cu, Al, Ag, Mo, Au, Ti, and an alloy thereof, or at least one of a nanowire, a photo sensitive nanowire film, a carbon nanotube (CNT), graphene and conductive polymer.

17. The touch device of claim 12, wherein the wire electrode is connected to the sensing electrode, and the wire electrode is spaced apart from the cover substrate.

18. A touch device comprising:

a case;

a driving unit including a light module; and a touch panel that receives a touch input, the touch panel including:
- a curved cover substrate having ends in contact with the case, the touch input being recognized throughout an entire area of the curved cover substrate;
- an electrode member including:
  - a substrate;
  - a sensing electrode having a first sensing electrode and a second sensing electrode, which are provided on one surface of the substrate;
  - a wire electrode having a first wire electrode to connect the first sensing electrode and a second wire electrode to connect the second sensing electrode, the first wire electrode and the second wire electrode provided on the one surface of the substrate; and
  - an insulating layer partially provided on the sensing electrode to insulate the first sensing electrode and the second sensing electrode, wherein a length from one end to another end of the curved cover substrate in one direction is shorter than a length from one end to another end of the electrode member, wherein the electrode member includes an overlapped portion corresponding to the cover substrate and having a shape corresponding to the curved cover substrate and a non-overlapped portion other than the overlapped portion, wherein at least a part of the non-overlapped portion is received in the case, and wherein a top surface of the sensing electrode is in direct contact with the lower portion of the curved cover substrate, a bottom surface of the substrate on which the sensing electrode is provided is in direct contact with the driving unit, and a top surface of the wire electrode is in direct contact with the case.

* * * * *